United States Patent
Yamao et al.

(10) Patent No.: US 9,022,343 B2
(45) Date of Patent: *May 5, 2015

(54) POLYCRYSTALLINE SILICON INGOT CASTING MOLD AND METHOD FOR PRODUCING SAME, AND SILICON NITRIDE POWDER FOR MOLD RELEASE MATERIAL FOR POLYCRYSTALLINE SILICON INGOT CASTING MOLD AND SLURRY CONTAINING SAME

(75) Inventors: Takeshi Yamao, Ube (JP); Michio Honda, Ube (JP); Shinsuke Jida, Ube (JP)

(73) Assignee: Ube Industries, Ltd., Ube-shi (JP)

(*) Notice: Subject to any disclaimer, the term of this patent is extended or adjusted under 35 U.S.C. 154(b) by 44 days.

This patent is subject to a terminal disclaimer.

(21) Appl. No.: 13/994,901

(22) PCT Filed: Jul. 27, 2011

(86) PCT No.: PCT/JP2011/067107
§ 371 (c)(1),
(2), (4) Date: Jun. 17, 2013

(87) PCT Pub. No.: WO2012/090541
PCT Pub. Date: Jul. 5, 2012

(65) Prior Publication Data
US 2013/0264460 A1    Oct. 10, 2013

(30) Foreign Application Priority Data

Dec. 28, 2010 (JP) .................... 2010-293060

(51) Int. Cl.
| C01B 33/02 | (2006.01) |
| B22C 1/00 | (2006.01) |
| B22C 3/00 | (2006.01) |
| C01B 21/068 | (2006.01) |
| B29C 33/54 | (2006.01) |
| C30B 11/00 | (2006.01) |
| C30B 29/06 | (2006.01) |
| B29C 33/58 | (2006.01) |

(52) U.S. Cl.
CPC ........... B29C 33/54 (2013.01); *Y10T 428/2982* (2015.01); C01B 21/068 (2013.01); C01B 33/02 (2013.01); *C01P 2004/03* (2013.01); *C01P 2004/61* (2013.01); *C01P 2004/62* (2013.01); C30B 11/002 (2013.01); C30B 29/06 (2013.01); B29C 33/58 (2013.01); C01B 21/0687 (2013.01); *C01P 2006/22* (2013.01); *C01P 2006/80* (2013.01)

(58) Field of Classification Search
CPC .. C01B 21/068; C01B 21/0687; C01B 33/02; C01P 2004/03; C01P 2004/61; C01P 2004/62; C01P 2006/22; C01P 2006/80; C30B 11/002; C30B 29/06; B29C 33/54; B29C 33/58
USPC ......... 106/38.27; 249/115; 427/133; 428/402
See application file for complete search history.

(56) References Cited

U.S. PATENT DOCUMENTS

| 5,001,091 A * | 3/1991 | Pujari et al. ............... 501/103 |
| 5,047,186 A * | 9/1991 | Huckabee et al. ........... 264/641 |
| 5,571,760 A * | 11/1996 | Pujari et al. ............... 501/97.2 |
| 5,585,084 A * | 12/1996 | Yamada et al. ............. 423/344 |
| 5,759,481 A * | 6/1998 | Pujari et al. ............... 264/655 |
| 2002/0164475 A1 * | 11/2002 | Imamura et al. ............ 428/325 |
| 2009/0119882 A1 | 5/2009 | Uibel |
| 2009/0159230 A1 | 6/2009 | Tsuchida et al. |
| 2009/0263638 A1 | 10/2009 | Faber et al. |

FOREIGN PATENT DOCUMENTS

| CN | 101844935 A | 9/2010 |
| JP | 9175809 A | 7/1997 |
| JP | 2907366 B2 | 4/1999 |
| JP | 2907367 B2 | 4/1999 |
| JP | 11244988 A | 9/1999 |
| JP | 2001198648 A | 7/2001 |
| JP | 3282456 B2 | 3/2002 |
| JP | 2004-91243 A * | 3/2004 |
| JP | 2004202813 A | 7/2004 |
| JP | 2004-262756 A * | 9/2004 |
| JP | 200595924 A | 4/2005 |
| JP | 2007261832 A | 10/2007 |
| JP | 2010195675 A | 9/2010 |
| WO | 2007039310 A1 | 4/2007 |
| WO | 2008026688 A1 | 3/2008 |

OTHER PUBLICATIONS

Machine Translation of Japanese Patent Specification No. JP 2004-202813 (Jul. 2004).*

* cited by examiner

*Primary Examiner* — Anthony J Green
(74) *Attorney, Agent, or Firm* — The Webb Law Firm (57) ABSTRACT

A polycrystalline silicon ingot casting mold, and method for producing same. Mold release material being obtained by blending a silicon nitride powder (A) having an average particle diameter along the short axis of 0.6 to 13 μm with a silicon nitride powder (B) having an average particle diameter along the short axis of 0.1 to 0.3 μm at a weight ratio of 5:5 to 9:1; coating the mold surface with the slurry; and a heating the mold at 800 to 1200° C. in an atmosphere containing oxygen.

6 Claims, 2 Drawing Sheets

POLYCRYSTALLINE SILICON INGOT CASTING MOLD AND METHOD FOR PRODUCING SAME, AND SILICON NITRIDE POWDER FOR MOLD RELEASE MATERIAL FOR POLYCRYSTALLINE SILICON INGOT CASTING MOLD AND SLURRY CONTAINING SAME

TECHNICAL FIELD

The present invention relates to a polycrystalline silicon ingot casting mold and a method for producing the same, silicon nitride powder for mold release material for a polycrystalline silicon ingot casting mold and a slurry containing the same.

BACKGROUND ART

As one type of semiconductor substrate for producing a solar cell, polycrystalline silicon is widely used and its production amount rapidly increases every year. Polycrystalline silicon is generally formed either by filling silicon melt, which is melt by heating at high temperature, in a mold in which an inner surface of a quartz crucible, a dividable graphite crucible, or a quartz crucible installed inside a graphite crucible is coated with a mold release material by spray or by using a brush or a spatula followed by solidification, or by melting first a silicon material added in a mold followed by re-solidification.

The release layer prevents incorporation of impurities to a silicon ingot and adhesion of heat-melted silicon melt onto an inner surface of a crucible as a mold, and thus plays an important role of releasing a solidified silicon ingot from the mold. As for the mold release material, from the viewpoint of having generally high melting point and little contamination for a silicon ingot, high purity powder such as silicon nitride, silicon carbide, and silicon oxide, or their mixture powder is used. For increasing productivity of a silicon ingot, many researches and studies have been made regarding a method of forming a mold release material on a mold surface, a mold obtained by such treatment, or a method for producing a silicon ingot by using such a mold.

For example, Patent Literature 1 discloses a release layer of a mold for casting a silicon ingot in which silicon nitride powder obtained by thermal decomposition of silicon diimide and fine silica powder are used as a mold release material and the release layer is formed of a first layer on an inner side (i.e., mold side) of the release layer, which has high ratio of silicon nitride containing non-crystalline silica layer on surface of silicon nitride particles, and a second layer on an outer side (i.e., silicon ingot side) of the release layer, in which particles are strongly bound to each other as mixed with fine silica powder. It is also disclosed that, by means of the release layer, damages occurring on a solidified silicon ingot and a mold can be reduced during release. In addition, it is disclosed in Patent Literature 2 that, by using a release layer based on a mixture in which coarse melt silica sands are covered with silicon nitride powder, reaction between melt silicon and silica is inhibited so that the performance of a battery for solar power generation can be enhanced.

CITATION LIST

Patent Literatures

Patent Literature 1: JP 2005-95924 A
Patent Literature 2: JP 2001-198648 A

SUMMARY OF INVENTION

Technical Problem

Meanwhile, with regard to the mold for silicon casting described in Patent Literature 1, the second layer in which particles are strongly bound to each other as mixed with fine silica powder (i.e., a layer on outer side of a release layer) has high oxygen content, and there is a high risk of having sticking onto a mold surface as a result of forming a solid solution with silicon melt. Further, since the method for forming a release layer disclosed in Patent Literature 1 requires preparation of a slurry of mold release material with difference silica concentration and there is almost no difference in color of each slurry, an incorrect coating order may be employed by mistake.

Further, the method of forming a release layer of Patent Literature 2 is problematic in that, since it is difficult to cover coarse melt silica sands with a release layer, molten silica sands are dispersed on outer surface of the release layer to form a solid solution of silica and silicon melt, whereby the silica sands stick on a mold surface and losses occur when releasing a solidified silicon ingot, yielding lower yield.

Meanwhile, since silica powder to be added to the mold release material disclosed in Patent Literature 1 and Patent Literature 2 has high alkali metal or alkali earth metal impurities, it is necessary to prepare high purity powder. Nevertheless, as described above, with regard to the release layer to be formed in a polycrystalline silicon ingot casting mold, it enhances the adhesiveness between a release layer and a mold and also the binding property among silicon nitride particles in a release layer, and thus addition of silica is believed to be effective. However, the release layer containing silicon melt and silica adheres onto a mold by solid solution reaction, thereby causing losses or damages that occur when a solidified silicon ingot is released, and thus there is a problem that it is difficult to produce a high quality silicon ingot with high yield.

The present invention is devised in view of the problems of prior art as described above, and object of the invention is to provide a polycrystalline silicon ingot casting mold and a method for producing the polycrystalline silicon ingot casting mold, in which a high-quality silicon ingot can be obtained at high yield by suppressing sticking of the casting mold surfaces and the silicon ingot, or losses and damages that occur when the solidified silicon ingot is released from the mold, and also a silicon nitride powder for mold release material for a polycrystalline silicon ingot casting mold and a slurry containing it.

Solution to Problem

Inventors of the present invention conducted intensive studies to solve the problems described above, and as a result have found that, by using silicon nitride powder with different particle diameter as a raw material of a release layer, a high-quality silicon ingot can be obtained at high yield by suppressing losses or damages that occur when a solidified silicon ingot is released from the mold. Specifically, according to the present invention, there is provided a method for producing a polycrystalline silicon ingot casting mold having a release layer, which is characterized by comprising a slurry forming step for forming a slurry by mixing a silicon nitride powder with water, the silicon nitride powder being obtained by blending a silicon nitride powder (A) having an average particle diameter along the short axis of 0.6 to 13 µm with a silicon nitride powder (B) having an average particle diameter along the short axis of 0.1 to 0.3 µm at a weight ratio of 5:5 to 9:1, a slurry coating step for coating the surface of the mold with the slurry, and a heating step for heating the mold at 800 to 1200° C. in an atmosphere containing oxygen, after the slurry coating step.

The invention also provides silicon nitride powder for mold release material for a polycrystalline silicon ingot casting mold, which is characterized by comprising a silicon nitride powder (A) having an average particle diameter along the short axis of 0.6 to 13 µm and a silicon nitride powder (B) having an average particle diameter along the short axis of 0.1 to 0.3 µm at a weight ratio of 5:5 to 9:1. The invention also provides a slurry containing the silicon nitride powder for mold release material for a polycrystalline silicon ingot casting mold, in which the silicon nitride powder is mixed with water, and a polycrystalline silicon ingot casting mold, in which a release layer is formed on an inner surface of a mold by using the silicon nitride powder.

Advantageous Effects of Invention

As described above, according to the present invention, there can be provided a polycrystalline silicon ingot casting mold which enables to produce a high-quality silicon ingot at high yield by suppressing sticking of a silicon ingot on a mold surface or suppressing an occurrence of losses or damages when a solidified silicon ingot is released and a method for producing the polycrystalline silicon ingot casting mold, silicon nitride powder for mold release material for a polycrystalline silicon ingot casting mold, and a slurry containing the silicon nitride powder for mold release material.

DESCRIPTION OF EMBODIMENTS

Figure 1:
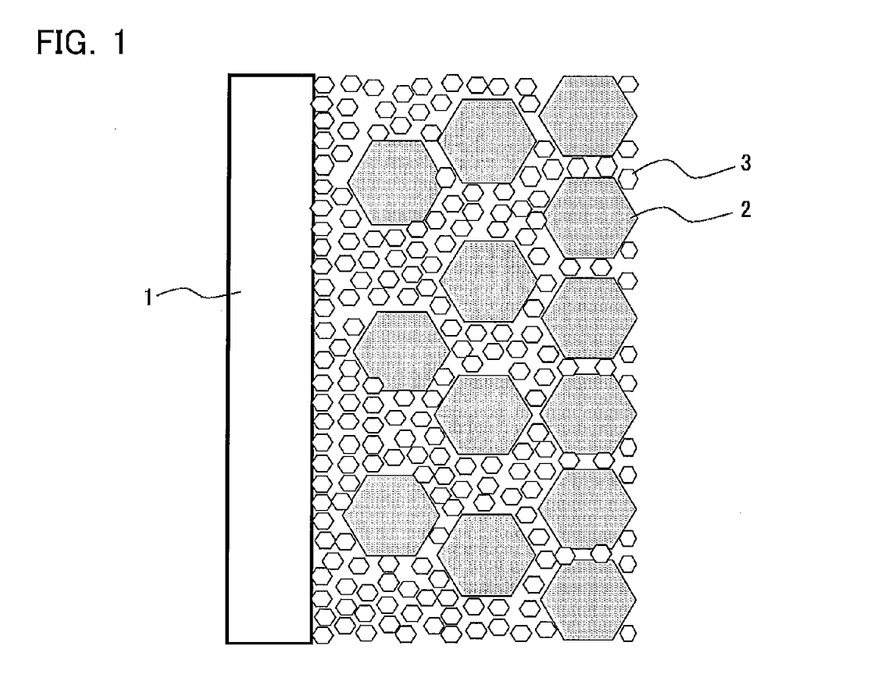
FIG. 1 is a conceptual diagram illustrating a state in which particles are localized in a release layer according to the present invention.

In the method for producing a polycrystalline silicon ingot casting mold having a release layer relating to the present invention, when a slurry containing silicon nitride powder obtained by mixing silicon nitride powder with water, the silicon nitride powder being obtained by blending a silicon nitride powder (A) having an average particle diameter along the short axis of 0.6 to 13 µM with a silicon nitride powder (B) having an average particle diameter along the short axis of 0.1 to 0.3 µm at a weight ratio of 5:5 to 9:1, is coated on an inner side of a mold, it is possible to form a release layer in which easily oxidizable fine particles are localized on an inner side (i.e., mold side) of the release layer while hardly oxidizable coarse particles are localized on an outer side (i.e., silicon ingot side) of the release layer as illustrated in FIG. 1 by utilizing a difference in movement rate based on particle size at the time of absorption by capillary force of a mold. Since easily oxidizable fine particles are localized on the surface of a mold side of a release layer, close adhesion between particles that are oxidized by baking and the mold can be obtained. In addition, since hardly oxidizable coarse particles are localized on a silicon ingot side, reaction with silicon melt is inhibited so that releasability can be improved at the time of release of the mold.

According to the method for producing a polycrystalline silicon ingot casting mold having a release layer according to the present invention, a mold with a release layer formed at low cost can be produced, an obtained mold has a release layer which contains little amount of metal impurities and has high density, excellent adhesiveness is obtained between a release layer and a mold. Therefore, permeation of a silicon melt caused by cracks or damages of a release layer is prevented, solid solution reaction between silicon melt and a release layer is suppressed, and also by having greatly improved releasability of a solidified silicon ingot from a mold, an occurrence of losses or damages at the time of releasing a solidified silicon ingot is suppressed, and thus a high-quality silicon ingot can be obtained at high yield.

In the method for producing a polycrystalline silicon ingot casting mold having a release layer according to the present invention, the slurry forming step is a step of mixing a silicon nitride powder with water, the silicon nitride powder being obtained by blending a silicon nitride powder (A) having an average particle diameter along the short axis of 0.6 to 13 µm with a silicon nitride powder (B) having an average particle diameter along the short axis of 0.1 to 0.3 at a weight ratio of 5:5 to 9:1.

Figure 2:
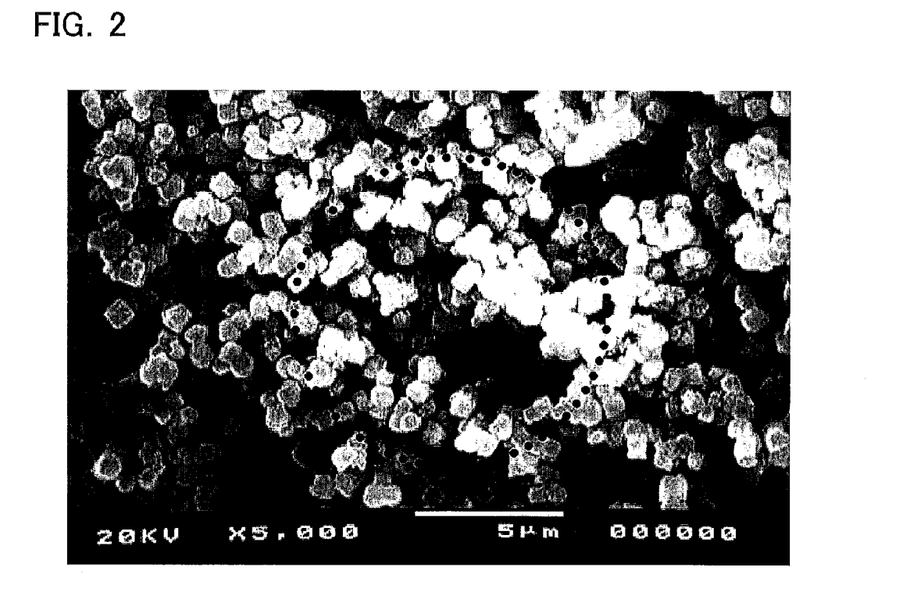
FIG. 2 is a SEM photograph (×5000 magnification) for measuring particle diameter along the short axis.

As described herein, the "average particle diameter along the short axis" indicates an average particle diameter along the short axis that is calculated by size measurement of a SEM image. The average particle diameter along the short axis calculated by size measurement of a SEM image is determined by drawing a circle to contact 50 to 200 particles of ×5000 SEM image illustrated in FIG. 2, determining the particle diameter along the short axis for all the particles in contact with the circle, and obtaining the average particle diameter. However, for fine particles, ×10000 SEM image is enlarged (400%) to give a copy, which is then used for measurement after drawing a circle as explained above. For coarse particles, ×1000 SEM image is used for measurement after drawing a circle as explained above.

In the present invention, the silicon nitride powder used for a release layer can be obtained by a method which includes calcining for crystallization non-crystalline silicon nitride powder obtained by thermal decomposition of the nitrogen-containing silane compound, which is obtained by a reaction between silicon halide and ammonia (i.e., imide method) or a method of pulverizing and classifying lump-like silicon nitride powder obtained by direct nitridation of metallic silicon powder (i.e., direct nitridation method).

For an imide method, for example, controlling particle size and particle shape of silicon nitride powder can be performed by, at the time of preparing non-crystalline silicon nitride powder, control of crystallization rate based on heating temperature and oxygen concentration for thermal decomposition and adjustment of particle growth rate based on temperature increase rate during calcination for crystallization.

When non-crystalline silicon nitride powder is prepared, as heating temperature for thermal decomposition is higher and also oxygen concentration in the obtained non-crystalline silicon nitride powder is higher, the crystallization starts at higher temperature and crystallization rate becomes faster. Further, as temperature increase rate between 1100 and 1250° C. is higher, needle-like crystal particles or fine agglomerate particles are more easily produced in conjunction with rapid progress of crystallization. On the other hand, as the heating temperature for thermal decomposition to prepare non-crystalline silicon nitride powder is lower and also the oxygen concentration in non-crystalline silicon nitride powder is smaller, the crystallization starts at lower temperature, yielding slower crystallization rate. Further, as slow temperature increase rate is lower between 1100 and 1250° C., the crystalline particle growth progresses more slowly, and thus coarse particulate crystalline particles are easily obtained. Particulate crystals of silicon nitride powder indicate the particles of hexagonal system with aspect ratio of 1.5 or less, that are not needle-like crystals or columnar crystals. It is possible to prepare, by adjusting a preparation condition based on the above characteristics, the silicon nitride powder (A) having an average particle diameter along the short axis of 0.6 to 13 µm and the silicon nitride powder (B) having an average particle diameter along the short axis of 0.1 to 0.3 µm.

Further, by pulverizing the obtained non-crystalline silicon nitride powder to the extent that coarse agglomerate particles with particle diameter of 50 µm or more in terms of particle diameter according to the volumetric particle size distribution, which is measured by using laser diffraction scattering method, are not contained, it becomes possible to produce silicon nitride powder with homogeneous particle size while suppressing production of particles with heterogeneous particle size and particle diameter due to simultaneous production of coarse particles, coarse agglomerate particles, needle-like crystal particles, and fine agglomerate particles due to abnormal crystal growth during calcination for crystallization are suppressed.

The silicon nitride powder prepared by the imide method described above is fine particles. Therefore, although there is a step of briefly pulverizing the agglomerate, the medium used for pulverization is a metal ball coated with resin or a sintered silicon nitride product, and thus the incorporation amount of metal impurities is extremely small, i.e., in several ppm or so, and thus it is a powder suitable for a raw material of mold release material for a polycrystalline silicon ingot casting mold. As described in JP 2007-261832 A, electric power generation efficiency of a solar cell is impaired by metal impurities that are included in a silicon ingot. It is particularly believed that the efficiency impairment is significant when polyvalent metals are incorporated. It is well known that the purity of a raw powder material itself as a mold release material has an influence on power generation efficiency, and thus less incorporation amount of metal impurities in a raw powder material as a mold release material is believed to be desirable. Preferred examples of the imide method include those described in JP 2907366 B1, JP 2907367 B1, or JP 3282456 B1.

The direct nitridation method is a method of obtaining silicon nitride powder by heat-treating metallic silicon under nitrogen or ammonia atmosphere to nitride it and pulverizing and purifying the nitrided lumps. When silicon nitride powder is produced by a direct nitridation method, time is required for pulverizing nitrided lumps, a great amount of metal impurities from a pulverizing medium is introduced, and the metal impurities remain in an amount of several hundred ppm or more even after a purification treatment of pulverized powder is carried out by using mineral acid. In particular, a material with high hardness used for a pulverizing medium, polyvalent metals like Cr and W, which are unlikely to dissolve during a purification treatment using mineral acid, are included in a great amount, and they usually remain in a great amount after a purification treatment. For such reasons, an imide method is favorable for the method of producing silicon nitride powder used in the invention.

Examples of the nitrogen-containing silane compound as a raw material for producing silicon nitride powder include silicon diimide ($Si(NH)_2$), silicon tetraamide, silicon nitrogen imide, and silicon chloroimide. They are prepared by a method known in the art, for example, a method of reacting silicon halide like silicon tetrachloride, silicon tetrabromide, or silicon tetraiodide with ammonia in gas phase or a method of reacting the silicon halide in liquid phase with liquid ammonia. Further, the non-crystalline silicon nitride powder can be obtained by a known method, for example, thermal decomposition of a nitrogen-containing silane compound in the temperature range of 1200 to 1460° C. under nitrogen or ammonia gas atmosphere or a method of reacting silicon halide like silicon tetrachloride, silicon tetrabromide, or silicon tetraiodide with ammonia at high temperature.

The silicon nitride powder (A) used for the slurry forming step has an average particle diameter along the short axis of 0.6 to 13 µm, and preferably 0.7 to 12 µm. When the silicon nitride powder (A) has an average particle diameter along the short axis of less than 0.6 µm, there is only a small difference in particle diameter compared to the silicon nitride powder (B), and thus it may not be possible to localize particle size in the release layer by utilizing a different movement rate depending on particle size during coating a slurry blended with silicon nitride powder and having it absorbed onto a mold based on capillary force. On the other hand, in order to produce particles having average particle diameter along the short axis of more than 13 µm, it is necessary that thermal decomposition temperature is lowered to temperature lower than 500° C., or temperature increase rate between 1100 and 1250° C. is lowered to rate of lower than 10° C./hr during calcination for crystallization without performing thermal decomposition, and thus the productivity is very poor and it is practically not useful.

The silicon nitride powder (A) having an average particle diameter along the short axis of 0.6 to 13 µm can be obtained by an imide method, for example, and prepared by adjusting heating temperature for thermal decomposition during preparation of non-crystalline silicon nitride powder, oxygen concentration in obtained non-crystalline silicon nitride powder, and temperature increase rate during calcination for crystallization.

Having a large average particle diameter along the short axis can be achieved by lowering heating temperature for thermal decomposition during preparation of non-crystalline silicon nitride powder, lowering oxygen concentration in obtained non-crystalline silicon nitride powder, and also slowing down the progress of crystallization particle growth by reducing the temperature increase rate between 1100 and 1250° C. during calcination for crystallization.

For example, when a silicon nitride powder having an average particle diameter along the short axis of 13 µm is to be produced, there is used a non-crystalline silicon nitride powder which enables lowering the crystallization start temperature during calcination for crystallization and slowing the crystallization rate by having heating temperature for thermal decomposition of 500° C. for producing a non-crystalline silicon nitride powder and oxygen concentration of less than 1 vol % in the gas introduced during thermal decomposition. Further, the non-crystalline silicon nitride powder is pulverized to the extent that coarse agglomerate particles with particle diameter of 50 µm or more in terms of particle diameter according to the volumetric particle size distribution, which is measured by using laser diffraction scattering method, are not contained therein. By using such non-crystalline silicon nitride powder and having the temperature increase rate between 1100 and 1250° C. of 10° C./hr, the crystallization particle growth is allowed to occur slowly, and thus the production can be achieved.

Further, when a silicon nitride powder having an average particle diameter along the short axis of 0.6 μm is to be produced, for example, use is made a non-crystalline silicon nitride powder which enables increasing the crystallization start temperature during crystallization and increasing the crystallization rate by having heating temperature for thermal decomposition of 500 to 800° C. for producing a non-crystalline silicon nitride powder and oxygen concentration of between 1 and 2 vol % in the gas introduced during thermal decomposition. Further, the non-crystalline silicon nitride powder is pulverized to the extent that coarse agglomerate particles with particle diameter of 50 μm or more in terms of particle diameter according to the volumetric particle size distribution, which is measured by using laser diffraction scattering method, are not contained therein. By using such non-crystalline silicon nitride powder and having the temperature increase rate between 1100 and 1250° C. of 50° C./hr or less, the crystallization particle growth is allowed to occur slowly, and thus the production can be achieved.

When the heating temperature for thermal decomposition at the time of producing a non-crystalline silicon nitride powder is high and oxygen concentration is also high in the obtained non-crystalline silicon nitride powder, crystallization start temperature during calcination for crystallization is high, and as crystallization rate becomes faster, the crystallization may progress significantly fast, so that it is difficult to produce silicon nitride powder having even particle size.

For example, when the heating temperature for thermal decomposition is higher than 800° C. during preparation of non-crystalline silicon nitride powder, even when the temperature increase rate between 1100 and 1250° C. is adjusted to 10 to 50° C./hr, the average particle diameter along the short axis of the powder obtained after calcination for crystallization is easily less than 0.6 μm, and further, as the crystallization rate is fast, needle-like crystal particles or fine agglomerate particles are produced, and thus it is difficult to produce silicon nitride powder with homogeneous particle size.

Further, when the temperature increase rate between 1100 and 1250° C. during calcination for crystallization is higher than 50° C./hr, it is difficult to control particle growth rate due to rapid crystallization, easily yielding needle-like crystal particles or fine agglomerate particles, and therefore it is difficult to produce silicon nitride powder with homogeneous particle size.

Further, if there are coarse agglomerate particles with particle diameter of 50 μm or more in terms of particle diameter according to the volumetric particle size distribution, which is measured by using laser diffraction scattering method of non-crystalline silicon nitride powder, coarse particles, coarse agglomerate particles, needle-like crystal particles, and fine particles are simultaneously produced in the coarse agglomerate particles due to abnormal crystal growth occurred during calcination for crystallization, so that particles with heterogeneous particle size and particle diameter are generated, making it impossible to produce silicon nitride powder with homogeneous particle size and it becomes difficult to control the particle diameter, and therefore undesirable.

Further, the silicon nitride powder (A) having an average particle diameter along the short axis of 0.6 to 13 μm can be produced by having heating temperature for thermal decomposition of 500 to 800° C. for producing a non-crystalline silicon nitride powder and oxygen concentration of between 0.4 and 2 vol % in the gas introduced during thermal decomposition, pulverizing it to the extent that coarse agglomerate particles with particle diameter of 50 μm or more in terms of particle diameter according to the volumetric particle size distribution, which is measured by using laser diffraction scattering method of the obtained non-crystalline silicon nitride powder, are not contained, and adjusting the temperature increase rate between 1100 and 1250° C. of 10 to 50° C./hr during calcination for crystallization.

The silicon nitride powder (B) used in the forming of the slurry has an average particle diameter along the short axis of 0.1 to 0.3 μm, and preferably 0.15 to 0.3 μm. When an average particle diameter along the short axis is more than 0.3 μm, there is only a small difference in particle diameter compared to the silicon nitride powder (A), and thus it may not be possible to localize particle size in the release layer by utilizing a different movement rate depending on particle size during coating a slurry blended with silicon nitride powder and having it absorbed onto a mold based on capillary force. Meanwhile, it is difficult to produce particles having an average particle diameter along the short axis of less than 0.1 μm by imide method which does not include a pulverization step. Even if a non-crystalline silicon nitride powder, which is obtained by increasing heating temperature for thermal decomposition for producing non-crystalline silicon nitride powder to 1100° C. or higher, increasing the oxygen concentration in the non-crystalline silicon nitride powder by having oxygen concentration of 5 vol % or more in the gas introduced during thermal decomposition, and enables increasing the crystallization start temperature during calcination for crystallization and increasing the crystallization rate, is used as a raw material, particles having an average particle diameter along the short axis of less than 0.1 μm can be produced, for example also by increasing the temperature increase rate between 1100 and 1250° C. during calcination for crystallization to rate of more than 100° C./hr. However, as the production ratio of needle-like crystal particles or fine agglomerate particles is also increased, a pulverizing step is necessary. Thus, in order to produce particles having an average particle diameter along the short axis of less than 0.1 μm, a pulverizing step is necessary, which inevitably leads to incorporation of metal impurities, and therefore it is undesirable as a raw material of a mold release material.

The silicon nitride powder (B) having an average particle diameter along the short axis of 0.1 to 0.3 μm can be obtained by an imide method, for example, and can be prepared by adjusting heating temperature for thermal decomposition during preparation of non-crystalline silicon nitride powder, oxygen concentration in obtained non-crystalline silicon nitride powder, and temperature increase rate during calcination for crystallization.

Further, when a small average particle diameter along the short axis is desired, the heating temperature for thermal decomposition is increased for producing a non-crystalline silicon nitride powder and non-crystalline silicon nitride powder having high oxygen concentration in the obtained non-crystalline silicon nitride powder is used as a raw powder material. By using such non-crystalline silicon nitride powder, the crystallization rate is increased, and therefore fine crystalline particle powder can be obtained. However, to suppress abnormal particle growth during calcination for crystallization or growth of mixed particles including needle-like crystal particles and fine agglomerate particles, it is necessary to carry out the pulverization to the extent that coarse agglomerate particles with particle diameter of 50 μm or more in terms of particle diameter according to the volumetric particle size distribution, which is measured by using laser diffraction scattering method of non-crystalline silicon nitride powder, are not contained. Further, by adjusting the temperature increase rate between 1100 and 1250° C. during calcination for crystallization, formation of needle-like crystal particles and fine agglomerate particles, which is accompanied with rapid progress of crystallization is suppressed so that silicon nitride powder with homogeneous particle size can be produced.

When a silicon nitride powder having an average particle diameter along the short axis of 0.1 μm is to be produced, for example, a non-crystalline silicon nitride powder which enables increasing the crystallization start temperature during calcination for crystallization and increasing the crystallization rate by having heating temperature for thermal decomposition of 1000° C. for producing a non-crystalline silicon nitride powder and oxygen concentration of 4 to 5 vol % in the gas introduced during thermal decomposition is used. Further, it is pulverized to the extent that coarse agglomerate particles with particle diameter of 50 μm or more in terms of particle diameter according to the volumetric particle size distribution, which is measured by using laser diffraction scattering method, are not contained in the non-crystalline silicon nitride powder. By using such non-crystalline silicon nitride powder and having the temperature increase rate between 1100 and 1250° C. of 80 to 100° C./hr, the crystallization particle growth is allowed to occur fast and also formation of needle-like crystal particles and fine agglomerate particles, which is accompanied with rapid progress of crystallization, is suppressed, and therefore a silicon nitride powder having homogenous particle size with an average particle diameter along the short axis of 0.1 μm can be obtained.

Further, when a silicon nitride powder having an average particle diameter along the short axis of 0.3 μm is to be produced, for example, a non-crystalline silicon nitride powder which enables increasing the crystallization start temperature during crystallization and increasing the crystallization rate by having heating temperature for thermal decomposition of 800 to 900° C. for producing a non-crystalline silicon nitride powder and oxygen concentration of 2.2 to 4 vol % in the gas introduced during thermal decomposition is used. Further, it is pulverized to the extent that coarse agglomerate particles with particle diameter of 50 μm or more in terms of particle diameter according to the volumetric particle size distribution, which is measured by using laser diffraction scattering method, are not contained in the non-crystalline silicon nitride powder. By using such non-crystalline silicon nitride powder and having the temperature increase rate between 1100 and 1250° C. of 60 to 80° C./hr, the crystallization particle growth is allowed to occur fast and also formation of needle-like crystal particles and fine agglomerate particles, which is accompanied with rapid progress of crystallization, is suppressed, and therefore a silicon nitride powder having homogenous particle size with an average particle diameter along the short axis of 0.3 μm can be obtained.

Further, when the heating temperature for thermal decomposition for producing non-crystalline silicon nitride powder is higher than 1100° C. and the oxygen concentration in the gas which is introduced for thermal decomposition is equal to or higher than 5 vol % and the obtained non-crystalline silicon nitride powder is used as a raw material, the crystallization start temperature becomes even higher and the crystallization rate becomes even faster during crystallization, and thus even if the temperature increase rate between 1100 and 1250° C. is controlled, it is difficult to produce a silicon nitride powder (B) having homogenous particle size with an average particle diameter along the short axis of 0.1 to 0.3 μm. In addition, the formation ratio of needle-like crystal particles or fine agglomerate particles is high in the powder after calcination for crystallization, and density of release layer is lower after coating. In addition, it may not be possible to utilize the difference in movement rate depending on particle size during coating the slurry blended with the silicon nitride powder and having it absorbed based on capillary force of a mold as it is hampered by needle-like crystal particles, and therefore undesirable.

Further, when the temperature increase rate between 1100 and 1250° C. is higher than 100° C./hr, crystallization control is difficult to achieve according to rapid progress of crystallization, and abnormal particle growth occurs or needle-like crystal particles and fine agglomerate particles are mixedly produced, making it difficult to produce the silicon nitride powder (B) having an average particle diameter along the short axis of 0.1 to 0.3 μm.

Producing the silicon nitride powder (B) having an average particle diameter along the short axis of 0.1 to 0.3 μm can be achieved by increasing heating temperature for thermal decomposition for producing non-crystalline silicon nitride powder to 800 to 1100° C., by having oxygen concentration of 2.2 to 5 vol % in the gas introduced during thermal decomposition, pulverizing the obtained non-crystalline silicon nitride powder to the extent that coarse agglomerate particles with particle diameter of 50 μm or more in terms of particle diameter according to the volumetric particle size distribution, which is measured by using laser diffraction scattering method, are not contained, and by controlling the temperature increase rate between 1100 and 1250° C. during calcination for crystallization to rate of 60 to 100° C./hr.

In the production method relating to the present invention, it is important that the silicon nitride powder (A) having an average particle diameter along the short axis of 0.6 to 13 μm and the silicon nitride powder (B) having an average particle diameter along the short axis of 0.1 to 0.3 μm are blended at a weight ratio of 5:5 to 9:1 in high purity silicon nitride powder. When the weight ratio of the silicon nitride powder (B) is higher than 5:5, for example, particle size gradient in a release layer based on a difference in movement rate in accordance with particle size can be obtained during coating a slurry containing a blend of silicon nitride powders and absorbing it based on capillary force of a mold. However, on a side which is closer to a silicon ingot side than the state illustrated in FIG. 1, ratio of fine particles increases and, although the overall adhesiveness and strength of a release layer are improved even at low baking temperature, there is a high risk of having cracks or damages caused by shrinkage during baking. In addition, as the oxygen concentration in a release layer at silicon ingot side is higher, the reactivity with silicon melt is increased, and therefore undesirable. Further, when the weight ratio of the silicon nitride powder (B) is lower than 9:1, for example, adhesiveness of a release layer with a mold and strength of a release layer are significantly lowered, and therefore undesirable.

A slurry containing silicon nitride powder, which is used for the slurry forming step, is a slurry obtained by mixing the silicon nitride powder with water, specifically by introducing a pre-determined amount of the silicon nitride powder into a vessel together with distilled water, filling with a silicon nitride ball, and stirring the mixture for a pre-determined time using a mixing crusher like vibration mill, ball mill, and paint shaker, or using a stirrer with wing such as paddle wing, or a high-speed planetary stirrer when no ball is used.

Since the silicon nitride powder (A) and (B) obtained by calcination for crystallization are in brief agglomerate particle state, when prepared as a slurry after dispersion in water by itself, slurry viscosity may easily increase. Thus, it is subjected to a brief pulverization treatment. For a step of briefly pulverizing agglomerate particles, a metal ball coated with resin or a sintered product of silicon nitride is used as a medium used for pulverization. As mixed amount of metal impurities is extremely small, i.e., in several ppm or so, it is a powder suitable as a raw material of a release material for a polycrystalline silicon ingot mold.

The coating of the slurry for producing a polycrystalline silicon ingot casting mold having a release layer according to the invention is a step of coating mold surface with the slurry containing silicon nitride powder, while maintaining the fluidity of the particles. The slurry containing silicon nitride powder is used for coating a mold release material, by which inner surface of a quartz crucible with porosity of 16 to 26% as a mold is coated with a release material using a spray, a brush, or a spatula, and the fluidity is preferably maintained such that the coated slurry is not released from a mold to the extent that it does not inhibit the movement of silicon nitride particles in a coated release layer.

When a mold is coated with the slurry containing silicon nitride powder, a release layer is formed due to absorption based on capillary phenomenon caused by fine pores present in a mold, whereby fine particles are attracted more to the mold near mold surface region, and fine particles are localized on an inner side (i.e., mold side), while coarse particles are localized on an outer side of the release layer (i.e., silicon ingot side) due to fewer fine particles. As a result, a state of conceptual drawing of FIG. 1, which illustrates the localized state of particles in the release layer, is obtained. Thus, when viscosity of the slurry containing silicon nitride powder is 500 P (poise) or higher, movement rate of silicon nitride particles in a release layer coated with the slurry containing silicon nitride powder is slow, and thus it is difficult, to have particle localization. In addition, when viscosity of the slurry containing silicon nitride powder described above is 1.5 cP (centipoise) or lower, the release layer coated with the slurry containing silicon nitride powder is easily sagged, making it difficult to maintain the release layer. Thus, it is necessary to adjust the slurry viscosity which can maintain fluidity of the particles and does not allow any sagging.

The method for producing a polycrystalline silicon ingot casting mold having a release layer according to the present invention may further include permeating moisture of slurry into the mold in order to have more sufficient absorption of the coated slurry containing silicon nitride powder based on capillary phenomenon by fine pores in a mold. Examples of the permeating of the moisture include drying at 30 to 120° C.

Figure 3:
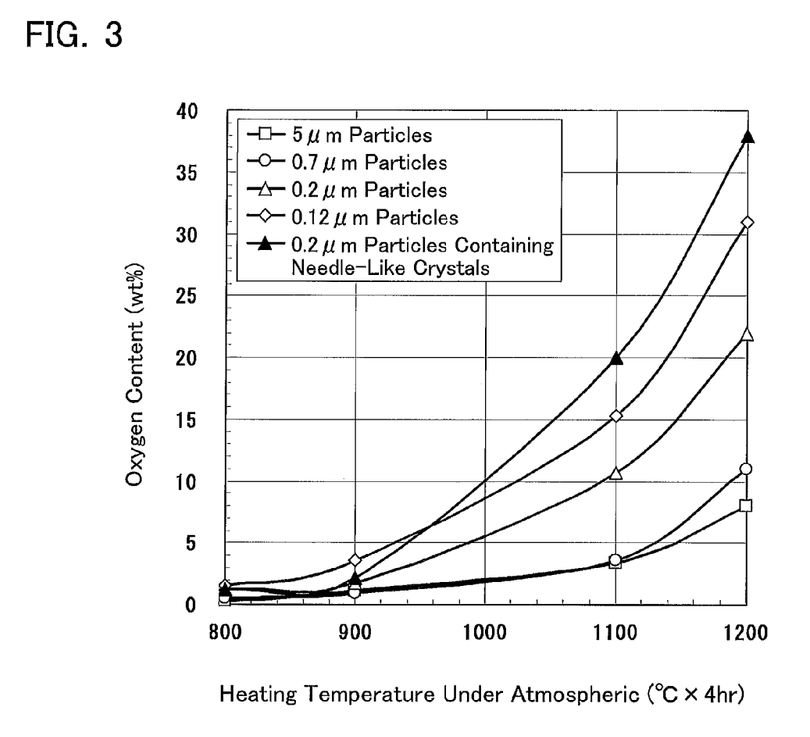
FIG. 3 is a graph illustrating a difference in oxidation behavior of silicon nitride powder having different particle diameter.

Further, in the method for producing a polycrystalline silicon ingot casting mold having a release layer relating to the present invention, the heating step is a step for carrying out a heating treatment of a mold coated with the slurry containing silicon nitride powder at 800 to 1200° C. under oxygen-containing atmosphere. The silicon nitride powder is oxidized at the temperature of 800° C. or higher under atmospheric air condition. In addition, when the temperature is higher than 1200° C., excessive oxidation state is yielded, and as illustrated in FIG. 3, fine particles are more easily oxidized while it is difficult for coarse particles to oxidize. By using a silicon nitride powder in which fine silicon nitride powder and coarse silicon nitride powder are blended, easily oxidizable fine particles are localized on an inner side (i.e., mold side) of the release layer to yield close adhesion between particles, that are oxidized by baking with calcination under oxygen-containing atmosphere, and close adhesion between particles and a mold, while hardly oxidizable coarse particles are localized on an outer side (i.e., silicon ingot side) of the release layer, to yield lower oxygen concentration on the surface of the release layer, and it also can prevent permeation by suppressing solid solution of silicon melt. Further, with regard to coating of the slurry containing silicon nitride powder, the above-described release layer can be formed by single coating. However, as the same effect can be obtained by two or more coatings, and therefore, a polycrystalline silicon ingot casting mold can be produced at low cost, and by preventing permeation of silicon melt, a solidified silicon ingot has improved releasability, and thus the silicon ingot can be produced at high yield.

The polycrystalline silicon ingot casting mold produced by the method for producing a polycrystalline silicon ingot casting mold having a release layer relating to the present invention is a mold for cast molding of a polycrystalline silicon ingot, which is characterized in that a release layer containing silicon nitride powder is formed on an inner side of a mold, and easily oxidizable fine particles are localized on an inner side (i.e., mold side) of the release layer while hardly oxidizable coarse particles are localized on an outer side (i.e., silicon ingot side) of the release layer, and therefore the mold side has high oxygen content and the silicon ingot side has low oxygen content. By using a polycrystalline silicon ingot casting mold having such release layer, the inner side (i.e., mold side) of the release layer exhibits close adhesion between particles, that are oxidized by baking for calcination under oxygen-containing atmosphere, and close adhesion between particles and a mold, and the outer side (i.e., silicon ingot side) of the release layer has lower oxygen concentration and can prevent permeation by suppressing solid solution of silicon melt, and thus the releasability of a solidified silicon ingot from a mold is greatly improved. Further, an occurrence of losses or damages during releasing the solidified silicon ingot is suppressed, and thus a high-quality silicon ingot can be obtained at high yield. The material of a mold is not particularly limited, and examples that can be generally used include a quartz crucible and a quartz crucible installed within a graphite crucible.

EXAMPLES

Herein below, the invention is explained in greater detail in view of the specific examples.

Examples 1 to 15

First of all, a crystalline silicon nitride required for producing a polycrystalline silicon ingot casting mold having a release layer relating to the present invention was prepared.

Silicon diimide was prepared by reacting a toluene solution containing silicon tetrachloride concentration in a concentration of 30 vol % with liquid ammonia followed by washing with liquid ammonia and drying.

The obtained silicon diimide powder was subjected to thermal decomposition at 500 to 800° C. under flow of air-nitrogen mixture gas (oxygen concentration in the mixture gas: 0.4 to 2 vol %) in an amount of 70 liter/hr per kilogram of powder to obtain a non-crystalline silicon nitride powder for producing the silicon nitride powder (A). In addition, the obtained silicon diimide powder was subjected to thermal decomposition at 800 to 1100° C. under flow of air-nitrogen mixture gas (oxygen concentration in the mixture gas: 2.2 to 4 vol %) in an amount of 70 liter/hr per kilogram of powder to obtain a non-crystalline silicon nitride powder for producing the silicon nitride powder (B).

The silicon nitride powder (A) described in the Examples 1 to 5 was prepared as follows. First, the heating temperature for thermal decomposition of the silicon diimide powder was adjusted to 700° C. and the oxygen concentration in the gas introduced for thermal decomposition was adjusted to 1 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 20° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to Examples 1 to 5, which has an average particle diameter along the short axis of 6.5 μm.

Similarly, the silicon nitride powder (A) relating to Examples 6 to 10 was prepared as follows. First, the heating temperature for thermal decomposition of the silicon diimide powder was adjusted to 750° C. and the oxygen concentration in the gas introduced for thermal decomposition was adjusted to 2 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 50° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to Examples 6 to 10, which has an average particle diameter along the short axis of 0.65 μm.

Similarly, the silicon nitride powder (A) relating to Examples 11 to 15 was prepared as follows. The heating temperature for thermal decomposition was adjusted to 500° C. and the oxygen concentration in the gas introduced for thermal decomposition was adjusted to 0.5 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 10° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to Examples 11 to 15, which has an average particle diameter along the short axis of 12.8 μm.

Subsequently, the silicon nitride powder (B) relating to Examples 1 to 10 was prepared as follows. First, the heating temperature for thermal decomposition of the silicon diimide powder was adjusted to 1050° C. and the oxygen concentration in the gas introduced for thermal decomposition was adjusted to 4 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 100° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to Examples 1 to 10, which has an average particle diameter along the short axis of 0.18 μm.

Similarly, the silicon nitride powder (B) relating Examples 11 to 15 was prepared as follows. First, the heating temperature for thermal decomposition the silicon diimide powder was adjusted to 900° C. and the oxygen concentration in the gas introduced for thermal decomposition was adjusted to 4 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 60° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to Examples 11 to 15, which has an average particle diameter along the short axis of 0.28

The obtained silicon nitride powder (A) has specific surface area of 0.2 to 3.0 $m^2/g$ and an average particle diameter along the short axis of 12.8 to 0.65 and the obtained silicon nitride powder (B) has specific surface area of 7 to 12.0 $m^2/g$ and an average particle diameter along the short axis of 0.29 to 0.18 μm.

10 g of mixed silicon nitride powder obtained by mixing the silicon nitride powders (A) and (B) at a weight ratio of 5:5 to 9:1, 40 g of distilled water, and 100 g of silicon nitride ball (10 φmm) were introduced into a 100 cc polyethylene bottle and sealed therein, and fixed on a vibration mill, followed by shaken for 5 min with amplitude of 5 mm and frequency of 1780 spm to give a 20% by weight aqueous slurry.

A quartz crucible (width×depth: 5 cm×4 cm) with porosity of 16%, which has been previously heated to 40° C., was coated with the above 20% by weight aqueous slurry was coated by spraying followed by drying at 40° C. The quartz crucible after coating was again dried overnight at 40° C. After drying, the temperature was increased to 1100° C. within 4 hours under atmospheric condition using a box type electric furnace. After keeping it for 4 hours at 1100° C. followed by cooling, the release layer was baked onto the quartz crucible. Thickness of each release layer was 100 to 200 μm as an average value of five point measurement.

In the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating release state. Further, Si melt permeation state in center bottom part of the crucible was observed with a naked eye. Further, after embedding the center bottom part of the crucible with an epoxy resin, a cross-section near the bottom part of the release layer was cut out, and then a cross-sectional view of the release layer (×100 magnification) was obtained by using FE-SEM to observe and evaluate the Si melt permeation state. The results are shown in Table 1.

In the permeation state of Si melt in crucible described in Table 1, ⊙ indicates that the permeation of silicon melt stops on surface of the release layer, ○ indicates that the permeation of silicon melt stops in the release layer, Δ indicates that a small amount of the silicon melt permeates into part of the quartz crucible, and x indicates that the silicon melt penetrates the quartz crucible and leaks from an opposite side of the bottom of crucible. Further, with regard to the release state of silicon ingot, ⊙ indicates that it is completely released without any partial sticking to the quartz crucible, ○ indicates that releasing can be made although there is slight sticking to the quartz crucible, Δ indicates that the lateral side of the quartz crucible is released but the bottom side is sticking, and x indicates complete sticking to the entire quartz crucible, showing no release.

TABLE 1

| | Formulation of silicon nitride particles | | | | | | Evaluation result of release layer | |
|---|---|---|---|---|---|---|---|---|
| | Silicon nitride powder (A) | | Silicon nitride powder (B) | | Mixing ratio based on weight | | | |
| Classification | SSA ($m^2/g$) | Average particle diameter along the short axis (μm) | SSA ($m^2/g$) | Average particle diameter along the short axis (μm) | (A) | (B) | Permeation state of Si melt in crucible | Release state of silicon ingot |
| Example-1 | 0.3 | 6.5 | 12.0 | 0.18 | 5 | 5 | ○ | ⊙ |
| Example-2 | 0.3 | 6.5 | 12.0 | 0.18 | 6 | 4 | ⊙ | ⊙ |
| Example-3 | 0.3 | 6.5 | 12.0 | 0.18 | 7 | 3 | ⊙ | ⊙ |
| Example-4 | 0.3 | 6.5 | 12.0 | 0.18 | 8 | 2 | ○ | ⊙ |
| Example-5 | 0.3 | 6.5 | 12.0 | 0.18 | 9 | 1 | ○ | ○ |
| Example-6 | 3.0 | 0.65 | 12.0 | 0.18 | 5 | 5 | ○ | ○ |
| Example-7 | 3.0 | 0.65 | 12.0 | 0.18 | 6 | 4 | ⊙ | ⊙ |
| Example-8 | 3.0 | 0.65 | 12.0 | 0.18 | 7 | 3 | ⊙ | ⊙ |
| Example-9 | 3.0 | 0.65 | 12.0 | 0.18 | 8 | 2 | ○ | ⊙ |
| Example-10 | 3.0 | 0.65 | 12.0 | 0.18 | 9 | 1 | ○ | ⊙ |
| Example-11 | 0.2 | 12.8 | 7.0 | 0.29 | 5 | 5 | ⊙ | ⊙ |
| Example-12 | 0.2 | 12.8 | 7.0 | 0.29 | 6 | 4 | ⊙ | ⊙ |
| Example-13 | 0.2 | 12.8 | 7.0 | 0.29 | 7 | 3 | ○ | ⊙ |
| Example-14 | 0.2 | 12.8 | 7.0 | 0.29 | 8 | 2 | ○ | ○ |
| Example-15 | 0.2 | 12.8 | 7.0 | 0.29 | 9 | 1 | ○ | ○ |
| Comparative Example-1 | A2 (First layer) | | B2 A2:silica = 9:1 Second layer) | | | | Δ | Δ |
| Comparative Example-2 | A2 (First layer) | | B3 (A2:silica = 8:2 Second layer) | | | | X | X |
| Comparative Example-3 | 0.3 | 6.5 | 12.0 | 0.18 | 3 | 7 | Δ | Δ |
| Comparative Example-4 | 0.3 | 6.5 | 12.0 | 0.18 | 10 | 0 | X | X |
| Comparative Example-5 | 3.0 | 0.65 | 12.0 | 0.18 | 3 | 7 | Δ | Δ |
| Comparative Example-6 | 3.0 | 0.65 | 12.0 | 0.18 | 10 | 0 | Δ | X |
| Comparative Example-7 | 0.2 | 12.8 | 7.0 | 0.29 | 3 | 7 | Δ | Δ |
| Comparative Example-8 | 0.2 | 12.8 | 7.0 | 0.29 | 10 | 0 | X | X |
| Comparative Example-9 | 0.3 | 6.5 | 4.5 | 0.43 | 7 | 3 | Δ | Δ |
| Comparative Example-10 | 3.0 | 0.65 | 4.5 | 0.43 | 7 | 3 | Δ | Δ |

Comparative Examples 1 and 2

The silicon nitride powder (trade name: SN-E10, manufactured by Ube Industries, Ltd.) having an average particle diameter along the short axis of 0.22 μm, which is manufactured by thermal decomposition of silicon diimide, the average particle diameter along the short axis being calculated by size measurement of a SEM image, was subjected to heating treatment for 3 hours at 1000° C. using a batch type electric furnace under atmospheric air flow to obtain the silicon nitride powder (A2) having oxygen concentration of 7.5% by weight. The oxygen concentration was measured by using a TC-136 device for simultaneous analysis of oxygen and nitrogen, which is manufactured by LECO Corporation. 10 g of the silicon nitride powder (A2), 40 g of distilled water, and 100 g of 10 φmm silicon nitride ball were sealed in a 100 cc polyethylene bottle and fixed on a vibration mill, followed by shaking for 5 min with amplitude of 5 mm and frequency of 1780 spm to give a 20% by weight aqueous slurry.

A quartz crucible (width×depth: 5 cm×4 cm) with porosity of 16%, which has been previously heated to 40° C. followed by drying at 40° C., was coated with above 20% by weight aqueous slurry by spraying. The quartz crucible after coating was again dried overnight at 40° C. After drying, the temperature was increased to 1100° C. within 4 hours under atmospheric condition using a box type electric furnace. After keeping it for 4 hours at 1100° C. followed by cooling, the release layer was baked onto the quartz crucible. Thickness of each release layer was 100 μm as an average value of five point measurement.

Next, the silicon nitride powder (A2) described above and silica powder having an average particle diameter of 0.05 μm as measured by a laser diffusion type particle size distribution analyzer, in which the silica powder has been confirmed to be non-crystalline by X-ray diffraction measurement device, were admixed with each other at a weight ratio of 9:1 (B2) or 8:2 (B3) to prepare 20% by weight aqueous slurries as described above, which were then sprayed on each quartz crucible which has been coated with the (A1). By keeping it for 4 hours at 1100° C. under atmospheric air condition, the release layer was baked on quartz crucible. Thickness of each release layer was 200 μm as an average value of five point measurement.

Next, in the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating releasability. Further, Si melt permeation state in center bottom part of the crucible was observed with a naked eye. Further, after embedding the center bottom part of the crucible with an epoxy resin, a cross-section was cut out, and then a cross-sectional view of the release layer (×100 magnification) was obtained by using FE-SEM to observe and evaluate the Si melt permeation state. The results are shown in the Table 1.

Comparative Examples 3 to 10

The crystalline silicon nitride required for a method for producing a polycrystalline silicon ingot casting mold was produced in the same manner as the Examples 1 to 15.

As for the silicon nitride powder (A) to be used in the Comparative Examples 3, 4, and 9, the silicon nitride powder (A) obtained in the Examples 1 to 5 was used.

Similarly, as for the silicon nitride powder (A) to be used in the Comparative Examples 5, 6, and 10, the silicon nitride powder (A) obtained in the Examples 6 to 9 was used.

Similarly, as for the silicon nitride powder (A) to be used in the Comparative Examples 7 and 8, the silicon nitride powder (A) obtained in the Examples 11 to 15 was used.

Then, as for the silicon nitride powder (B) to be used in the Comparative Examples 3 to 6, the silicon nitride powder (B) obtained in the Examples 1 to 10 was used.

Similarly, as for the silicon nitride powder (B) to be used in the Comparative Examples 7 and 8, the silicon nitride powder (B) obtained in the Examples 11 to 15 was used.

Further, the silicon nitride powder (B) to be used in the Comparative Examples 9 and 10 was prepared as follows. First, with regard to the silicon diimide powder, the heating temperature was adjusted to 850° C. and the oxygen concentration in the gas introduced for thermal decomposition was adjusted to 2 vol % for producing a non-crystalline silicon nitride powder, and the obtained non-crystalline silicon nitride powder was pulverized using a continuous vibration mill filled with metal balls coated with nylon to the extent that coarse agglomerate particles with particle diameter of 50 μm or more in terms of particle diameter according to the volumetric particle size distribution, which is measured by laser diffraction scattering method, are not contained. The pulverized non-crystalline silicon nitride powder were added to a crucible made of graphite, and the temperature was increased to 1100° C. for 4 hours, and further increased to 1550° C. for 4 hours while having the temperature increase rate of 50° C./hr between 1100 and 1250° C. After keeping and calcining it at 1550° C. for 1 hr followed by cooling, the powder was taken out and subjected to brief pulverization by using a continuous vibration mill filled with metal balls coated with nylon to obtain silicon nitride powder relating to the Comparative Examples 9 and 10, which has an average particle diameter along the short axis of 0.43 μm.

The obtained silicon nitride powder (A) has specific surface area of 0.2 to 3.0 $m^2/g$ and an average particle diameter along the short axis of 12.8 to 0.65 μm, and the obtained silicon nitride powder (B) has specific surface area of 4.5 to 12.0 $m^2/g$ and an average particle diameter along the short axis of 0.43 to 0.18 μm.

10 g of mixed silicon nitride powder obtained by mixing several kinds of the silicon nitride powder (A) and (B) at a combination and a blending ratio described in the Table 1, 40 g of distilled water, and 100 g of silicon nitride ball (10 φmm) were introduced into a 100 cc polyethylene bottle sealed therein, and fixed on a vibration mill, followed by shaking for 5 min with amplitude of 5 mm and frequency of 1780 spm to give a 20% by weight aqueous slurry. A quartz crucible (width×depth: 5 cm×4 cm) with porosity of 16%, which has been previously heated to 40° C., was coated with the resulting 20% by weight aqueous slurry was prepared as described above by spraying followed by drying at 40° C. The quartz crucible after coating was again dried overnight at 40° C. After drying, the temperature was increased to 1100° C. within 4 hours under atmospheric condition using a box type electric furnace. After keeping it for 4 hours at 1100° C. followed by cooling, the release layer was baked onto the quartz crucible. Thickness of each release layer was 100 to 200 μm as an average value of five point measurement.

Next, in the quartz crucible with baked release layer, 75 g of 2 to 5 mm Si granules having purity of 99.999% were filled. Using a box type electric furnace, it was maintained for 3 hours until 1000° C., 3 hours from 1000° C. to 1450° C., and 4 hours at 1450° C. under Ar flow of atmospheric pressure followed by cooling. After cooling, it was taken out of the furnace and observed for evaluating release state. Further, Si melt permeation state in center bottom part of the crucible was observed with a naked eye. Further, after embedding the center bottom part of the crucible with an epoxy resin, a cross-section was cut out, and then a cross-sectional view of the release layer (×100 magnification) was obtained by using FE-SEM to observe the Si melt permeation state. The results are shown in the Table 1.

REFERENCE SIGNS LIST

1 casting mold
2 coarse silicon nitride particles
3 fine silicon nitride particles

The invention claimed is:

1. A method for producing a polycrystalline silicon ingot casting mold having a release layer, comprising:
    forming a slurry by mixing a silicon nitride powder with water, the silicon nitride powder being obtained by blending a silicon nitride powder (A) having an average particle diameter along a short axis of 0.65 to 13 μm with a silicon nitride powder (B) having an average particle diameter along a short axis of 0.1 to 0.3 μm at a weight ratio of 5:5 to 9:1,
    coating a surface of a casting mold with the slurry, and
    heating the casting mold at 800 to 1200° C. in an atmosphere containing oxygen, after the coating of the slurry.

2. The method according to claim 1, further comprising permeating moisture of the slurry with which the surface of casing mold is coated, into the casing mold and the heating is performed after the permeating of the moisture.

3. A silicon nitride powder mold release material for a polycrystalline silicon ingot casting mold, comprising a silicon nitride powder (A) having an average particle diameter along the short axis of 0.65 to 13 μm and a silicon nitride powder (B) having an average particle diameter along the short axis of 0.1 to 0.3 μm, a weight ratio of the silicon nitride powder (A) to the silicon nitride powder (B) being 5:5 to 9:1.

4. A slurry containing a silicon nitride powder mold release material for a polycrystalline silicon ingot casting mold, comprising the silicon nitride powder according to claim 3, and water mixed therewith.

5. A polycrystalline silicon ingot casting mold having a release layer formed on an inner surface of the casting mold by utilizing the silicon nitride powder according to claim 3.

6. A silicon nitride powder mold release layer on a polycrystalline silicon ingot casting mold, comprising a silicon nitride powder (A) having an average particle diameter along the short axis of 0.65 to 13 μm and a silicon nitride powder (B) having an average particle diameter along the short axis of 0.1 to 0.3 μm, a weight ratio of the silicon nitride powder (A) to the silicon nitride powder (B) being 5:5 to 9:1.

* * * * *

UNITED STATES PATENT AND TRADEMARK OFFICE
CERTIFICATE OF CORRECTION

PATENT NO. : 9,022,343 B2
APPLICATION NO. : 13/994901
DATED : May 5, 2015
INVENTOR(S) : Takeshi Yamao et al.

Page 1 of 1

It is certified that error appears in the above-identified patent and that said Letters Patent is hereby corrected as shown below:

In the Claims

Column 19, Line 16, Claim 2, delete "casing" and insert -- casting --

Column 19, Line 16, Claim 2, delete "the casing" and insert -- the casting --

Signed and Sealed this
Twenty-fourth Day of November, 2015

Michelle K. Lee
*Director of the United States Patent and Trademark Office*